(12) United States Patent
Tachibana (10) Patent No.: US 11,552,643 B1
(45) Date of Patent: Jan. 10, 2023

(54) SEMICONDUCTOR INTEGRATED CIRCUIT AND RECEIVER DEVICE

(71) Applicant: Kioxia Corporation, Tokyo (JP)

(72) Inventor: Fumihiko Tachibana, Yokohama (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/644,127

(22) Filed: Dec. 14, 2021

(30) Foreign Application Priority Data

Sep. 17, 2021 (JP) .............................. JP2021-152236

(51) Int. Cl.
*H03L 7/08* (2006.01)
*H04L 7/00* (2006.01)
*H03M 1/34* (2006.01)

(52) U.S. Cl.
CPC ............ *H03L 7/0807* (2013.01); *H03M 1/34* (2013.01); *H04L 7/0083* (2013.01); *H03L 2207/14* (2013.01)

(58) Field of Classification Search
CPC ....... H03L 7/0807; H03M 1/34; H04L 7/0083
See application file for complete search history.

(56) References Cited

U.S. PATENT DOCUMENTS

| | | | |
|---|---|---|---|
| 8,570,078 B2 | 10/2013 | Sato | |
| 10,404,496 B1* | 9/2019 | Azenkot | ............ H04B 10/6165 |
| 10,985,764 B1* | 4/2021 | Lin | ........................ H04L 7/0041 |
| 2022/0216979 A1* | 7/2022 | Kim | ........................ H03L 7/093 |

FOREIGN PATENT DOCUMENTS

| | | |
|---|---|---|
| JP | 6-132818 A | 5/1994 |
| JP | 2006-174358 A | 6/2006 |
| JP | 2013-70254 A | 4/2013 |

OTHER PUBLICATIONS

Dokania, R. et al. "A 5.9pJ/b 10Gb/s Serial Link with Unequalized MM-CDR in 14nm Tri-Gate CMOS" IEEE, ISSCC, Session 10, Advanced Wireline Techniques and PLLs, 10.5. (2015) 3 pages.

* cited by examiner

*Primary Examiner* — Patrick C Chen
(74) *Attorney, Agent, or Firm* — Oblon, McClelland, Maier & Neustadt, L.L.P.

(57) ABSTRACT

A semiconductor integrated circuit includes a converter converting an analog signal into a digital signal based on a clock signal; a comparator determining values of data based on the digital signal; a recovery circuit recovering the clock signal based on the digital signal and the data; and a control circuit. The recovery circuit includes a phase detector calculating a sum of a first value and offset, the first value being a value based on the digital signal and the data and relating to a phase of the clock signal; and a loop filter calculating a correction amount of the phase of the clock signal based on the sum. The control circuit is configured to gradually change the offset from a second value to zero after the second value is added as the offset.

16 Claims, 7 Drawing Sheets

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2021-152236, filed Sep. 17, 2021, the entire contents of which are incorporated herein by reference.

FIELD

Embodiments described herein relate generally to a semiconductor integrated circuit and a receiver device.

BACKGROUND

A transmitter device and a receiver device are coupled to each other via a transmission path. The receiver device receives a reception signal that has passed through the transmission path. The receiver device includes a semiconductor integrated circuit configured to process a received signal. The receiver device recovers a clock signal based on the received signal. The receiver device recovers data from the received signal based on the recovered clock signal. The receiver device includes a clock data recovery circuit configured to recover a clock signal and data based on the received signal.

DETAILED DESCRIPTION

In general, according to one embodiment, a semiconductor integrated device includes: a converter configured to convert an analog signal into a digital signal based on a clock signal; a comparator circuit configured to determine values of data based on the digital signal; a recovery circuit configured to recover the clock signal based on the digital signal and the data; and a control circuit configured to control the recovery circuit. The recovery circuit includes: a phase detector configured to calculate a sum of a first value and a first offset, the first value being a value based on the digital signal and the data and relating to a phase of the clock signal; and a loop filter configured to calculate a correction amount of the phase of the clock signal based on the sum. The control circuit is configured to gradually change the first offset from a second value to zero after the second value is added as the first offset.

Hereinafter, embodiments will be described with reference to the accompanying drawings.

The description provided hereinafter use the same reference symbol for components having approximately the same function and configuration. Especially when components having the same or substantially the same configuration are to be distinguished from each other, different characters or numerals may be added to the common reference symbol.

1. First Embodiment

A first embodiment will be described.

1.1 Configuration

A configuration according to a first embodiment will be described.

1.1.1 Information Processing System

Figure 1:
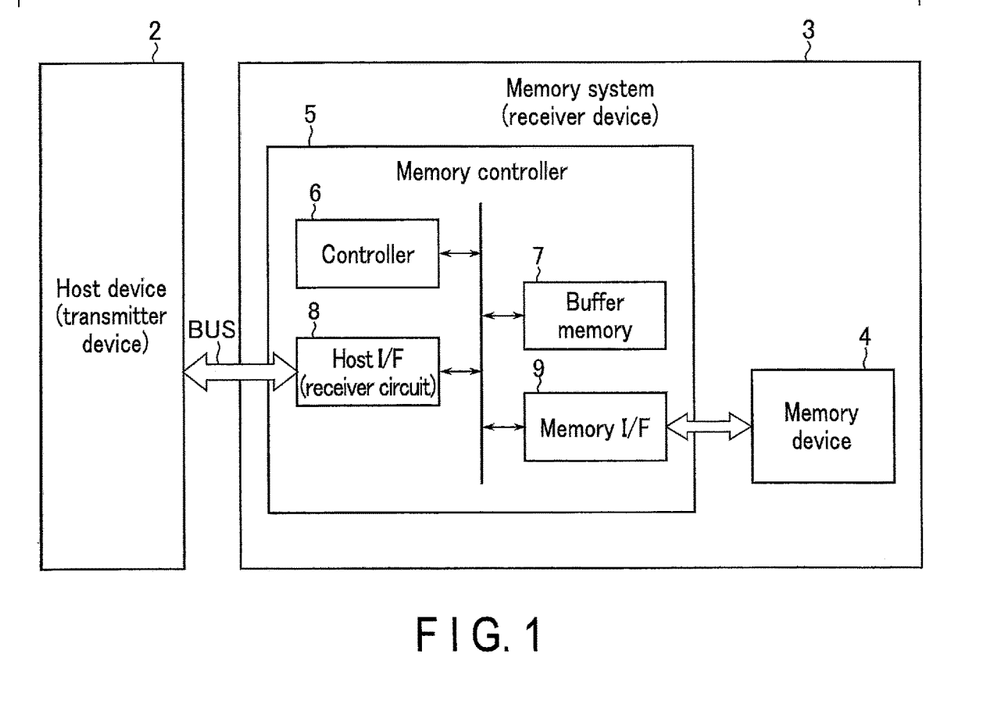
FIG. 1 is a block diagram showing an example of a configuration of an information processing system including a receiver device according to a first embodiment.

First, a configuration of an information processing system including a receiver device according to the first embodiment will be described. FIG. 1 is a block diagram showing an example of the configuration of the information processing system including the receiver device according to the first embodiment.

An information processing system 1 is a system for transmitting information thereinside through serial communication. The information processing system 1 includes a host device 2 and a memory system 3. The memory system 3 can be coupled to the host device 2.

The host device 2 is an information processing device installed outside the memory system 3. The host device 2 is, for example, a personal computer or a server installed in a data center. The host device 2 transmits various requests to the memory system 3. When transmitting a request to the memory system 3, the host device 2 functions as a transmitter device.

The memory system 3 is a memory device. Examples of the memory system 3 include a memory card such as an SD™ card, a universal flash storage (UFS) device, and a solid state drive (SSD). The memory system 3 executes a data write operation, a data read operation, or a data erase operation in response to a request from the host device 2. When receiving a request from the host device 2, the memory system 3 functions as a receiver device.

1.1.2 Memory System

An internal configuration of the memory system according to the first embodiment will be described.

The memory system 3 includes a memory device 4 and a memory controller 5.

The memory device 4 is, for example, a nonvolatile memory. The memory device 4 is, for example, a NAND flash memory. The memory device 4 non-volatilely stores data.

The memory controller 5 is configured by, for example, an integrated circuit such as a system-on-a-chip (SoC). The memory controller 5 controls the memory device 4 based on a request from the host device 2. Specifically, the memory controller 5, for example, writes write data to the memory device 4 based on a write request from the host device 2. The memory controller 5 also reads read data from the memory device 4 based on a read request from the host device 2. The memory controller 5 transmits the read data to the host device 2.

Next, an internal configuration of the memory controller 5 will be described. The memory controller 5 includes a controller 6, a buffer memory 7, a host interface circuit 8 (host I/F), and a memory interface circuit 9 (memory I/F). The functions of the memory controller 5, which will be described below, can be implemented in a hardware configuration or in a combined configuration of hardware resources and firmware.

The controller 6 is a circuit which controls the entire memory controller 5. The controller 6 includes, for example, a processor such as a central processing unit (CPU), and a read only memory (ROM).

The buffer memory 7 is, for example, a static random access memory (SRAM). The buffer memory 7 buffers data transmitted between the host device 2 and the memory device 4. The buffer memory 7 temporarily stores write data and read data.

The host interface circuit 8 is a semiconductor integrated circuit. The host interface circuit 8 controls communication between the memory controller 5 and the host device 2. When receiving a request from the host device 2, a part of the host interface circuit 8 functions as a receiver device. The host interface circuit 8 is coupled to the host device 2 via a host bus BUS. The host bus BUS is compatible with, for example, an SD™ interface, a serial attached SCSI (small computer system interface) (SAS), a serial ATA (advanced technology attachment) (SATA), or a PCI (peripheral component interconnect) Express™ (PCIe).

The memory interface circuit 9 is a semiconductor integrated circuit. The memory interface circuit 9 controls communication between the memory device 4 and the memory controller 5. The memory interface circuit 9 is coupled to the memory device 4 via a memory bus. The memory bus is compatible with, for example, a single data rate (SDR) interface, a toggle double data rate (DDR) interface, or an open NAND flash interface (ONFI).

1.1.3 Host Interface Circuit (Receiver Circuit)

Figure 2:
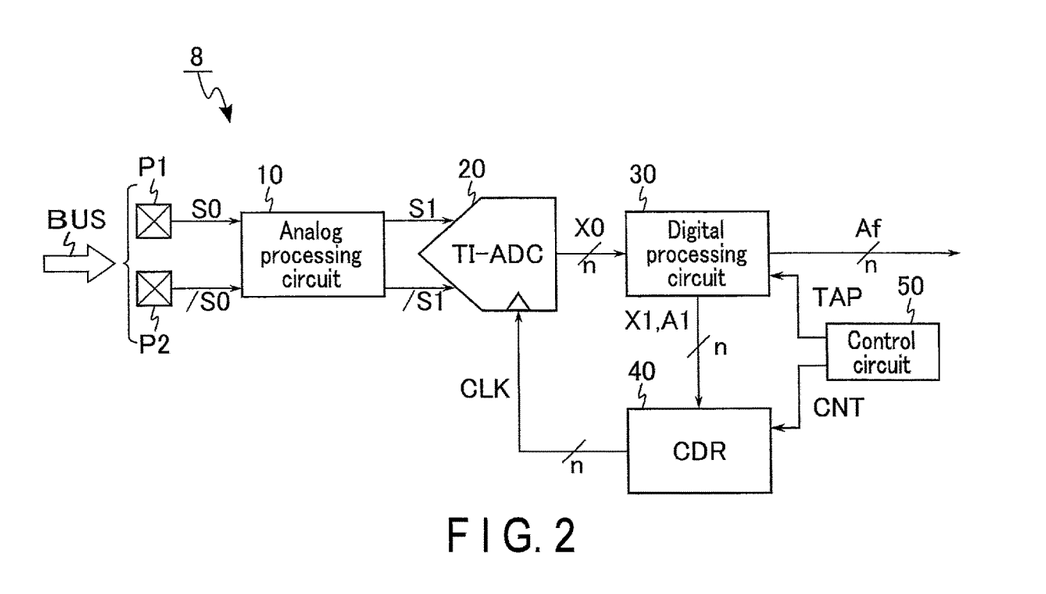
FIG. 2 is a block diagram showing an example of a configuration of a receiver circuit according to the first embodiment.

Next, an internal configuration of a part corresponding to the receiver circuit included in the host interface circuit according to the first embodiment will be described. FIG. 2 is a block diagram showing an example of a configuration of the receiver circuit of the receiver device according to the first embodiment.

The host interface circuit 8 includes pads P1 and P2, an analog processing circuit 10, a TI-ADC 20, a digital processing circuit 30, a CDR 40, and a control circuit 50.

Each of the pads P1 and P2 is a terminal coupled to the host bus BUS. The example shown in FIG. 2 illustrates a case where the pads P1 and P2 receive signals S0 and /S0, respectively, from the host device 2 via the host bus BUS.

The signals S0 and /S0 are differential signals. Before passing through the host bus BUS, the signals S0 and /S0 are, for example, pulse signals. Data from the host device 2 is superposed on each pulse of the signals S0 and /S0. A voltage level for each pulse of the signals S0 and /S0 corresponds to 1-bit or multiple-bit data. In the description below, a case is assumed where 2-bit data is superposed on one pulse. Such a data transmission format is also referred to as a four-level pulse amplitude modulation (PAM4).

By passing through the host bus BUS, the signals S0 and /S0 are subjected to loss due to the transmission characteristics (e.g., frequency characteristics) of the host bus BUS. This results in occurrence of inter-symbol interference (ISI) in the signals S0 and /S0 that have passed through the host bus BUS. As such, the signals S0 and /S0 that have passed through the host bus BUS are processed as analog signals.

The analog processing circuit 10 is an analog front end (AFE). The analog processing circuit 10 includes, for example, a continuous time linear equalizer (CTLE) and a variable gain amplifier (VGA). The CTLE is an amplifier circuit with frequency characteristics that compensate for the frequency characteristics of the host bus BUS. The VGA is an amplifier circuit capable of varying its gain. The signals S0 and /S0 are input from the pads P1 and P2, respectively, to the analog processing circuit 10. The analog processing circuit 10 uses the CTLE and the VGA to perform analog processing on the signals S0 and /S0. The analog processing circuit 10 generates signals S1 and/S1 based on the signals S0 and /S0. The analog processing circuit 10 outputs the signals S1 and/S1 to the TT-ADC 20.

The TI-ADC 20 is a time-interleaved A/D converter. The signals S1 and/S1 are input from the analog processing circuit 10 to the TI-ADC 20, and a signal CLK is input from the CDR 40 to the TI-ADC 20. The TI-ADC 20 converts the signals S1 and/S1 to a signal X0 based on the signal CLK. The TI-ADC 20 outputs the signal X0 to the digital processing circuit 30.

The signal CLK includes n clock signal(s). Here, n is an integer equal to or greater than 1 (e.g., 32). For example, the phases of the n clock signal(s) of the signal CLK differ from each other by at least 360°/n. The frequency of the signal CLK may be equal to the frequency of the clock signal(s) embedded in the signals S0 and /S0 by the host device 2. The frequency of the signal CLK may be different from the frequency of the clock signal(s) embedded in the signals S0 and /S0 by the host device 2.

The signal X0 is a digital signal. The signal X0 includes a plurality of continuous digital values. A bit value of a single digital value included in the signal X0 is sampled from a single symbol of the signals S1 and/S1 based on a single clock signal of the signal CLK. A single digital value is, for example, 7-bit data. Each bit value of continuous n digital values included in the signal X0 is sampled from continuous n symbols of the signals S1 and/S1 based on n clock signals of the signal CLK. Hereinafter, the cycle in which continuous n digital values included in the signal X0 are generated by the TI-ADC 20 will also be simply referred to as a "cycle". The continuous n digital values included in the signal X0 are also referred to as a "one-cycle signal X0".

The digital processing circuit 30 includes, for example, a feed forward equalizer (FFE), a decision feedback equalizer (DFE), and a data comparator circuit. The configuration of the digital processing circuit 30 will be described later. The signal X0 is input to the digital processing circuit 30. The digital processing circuit 30 uses the FFE, the DFE, and the data comparator circuit to perform digital processing on the signal X0. Specifically, the digital processing circuit 30 generates a signal X1 and data A1 and Af based on the signal X0. The digital processing circuit 30 outputs the signal X1 and the data A1 to the CDR 40. The digital processing circuit 30 outputs the data Af to a subsequent circuit (not shown). The generation of the signal X1 and the data A1 and Af will be detailed later.

The CDR 40 is a clock data recovery circuit. The signal X1 and the data A1 are input to the CDR 40 for each cycle. The CDR 40 calculates a phase correction amount of the signal CLK based on the signal X1 and the data A1. The CDR 40 recovers the signal CLK based on the calculated phase correction amount. The CDR 40 outputs the recovered signal CLK to the TI-ADC 20 for each cycle. In this manner, the CDR 40 recovers the signal CLK serving as a basis of the sampling timing of a subsequent one-cycle signal X0 based on the signal X1 and the data A1 generated from a one-cycle signal X0. Such cycling processing performed for each cycle by the TI-ADC 20, the digital processing circuit 30, and the CDR 40 is also referred to as a "CDR loop".

The control circuit 50 includes, for example, a processor such as a CPU, and a ROM. The control circuit 50 controls the entire host interface circuit 8. The control circuit 50 outputs a signal TAP to the digital processing circuit 30 and outputs a signal CNT to the CDR 40. The signal TAP is a signal that controls information on the computation function (e.g., a tap coefficient) of the FFE and the DFE of the digital processing circuit 30. The signal CNT is a signal that controls information on the computation function (e.g., a parameter used to calculate a phase correction amount) of the CDR 40.

1.1.4 Digital Processing Circuit

Figure 3:
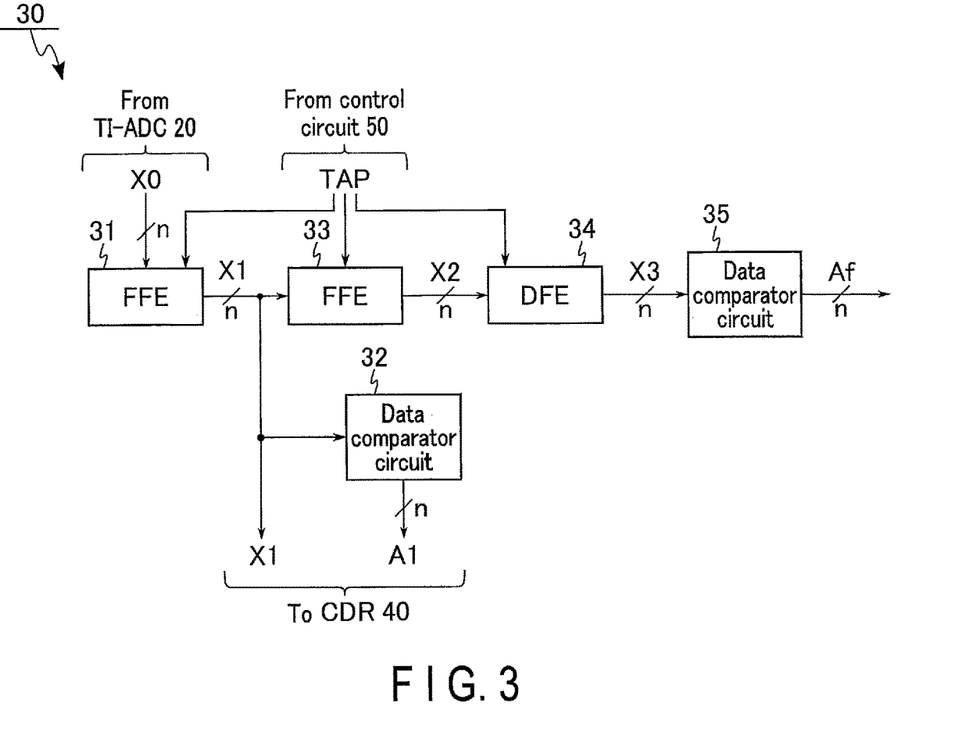
FIG. 3 is a block diagram showing an example of a configuration of a digital processing circuit of the receiver circuit according to the first embodiment.

Next, an internal configuration of the digital processing circuit of the receiver circuit according to the first embodiment will be described. FIG. 3 is a block diagram showing an example of a configuration of the digital processing circuit of the receiver circuit according to the first embodiment.

The digital processing circuit 30 includes an FFE 31, a data comparator circuit 32, an FFE 33, a DFE 34, and a data comparator circuit 35.

The signal X0 is input to the FFE 31. The FFE 31 performs, for each of the n digital values included in a one-cycle signal X0, computation processing using a digital value to be computed and digital values corresponding to several symbols before and after the digital value to be computed. The computation processing performed by the FFE 31 uses tap coefficients that are based on some of the signals TAP input from the control circuit 50. The FFE 31 generates the signal X1 as a result of the computation processing. Namely, the signal X1, like the signal X0, is a digital signal. A one-cycle signal X1 is a collection of n digital values. The FFE 31 outputs the signal X1 to the data comparator circuit 32, the FFE 33, and the CDR 40.

The signal X1 is input to the data comparator circuit 32. Based on the signal X1, the data comparator circuit 32 determines data encoded by the host device 2, as the data A1. Specifically, when the PAM4 is applied, the data comparator circuit 32 determines the values of 2-bit data for each of the n digital values included in a one-cycle signal X1. The data comparator circuit 32 outputs the data A1 to the CDR 40.

The signal. X1 is input to the FFE 33. The FFE 33 performs, for each of the n digital values included in a one-cycle signal X1, computation processing using a digital value to be computed and digital values corresponding to several symbols before and after the digital value to be computed. In the computation processing performed by the FFE 33, tap coefficients based on a signal, from among the signals TAP input from the control circuit 50, that is different from the signal used in the computation processing performed by the FFE 31 is used. The FFE 33 generates a signal X2 as a result of the computation processing. Namely, the signal X2, like the signals X0 and X1, is a digital signal. A one-cycle signal X2 is a collection of n digital values. The FFE 33 outputs the signal X2 to the DFE 34.

The signal X2 is input to the DFE 34. The DFE 34 performs, for each of the n digital values included in a one-cycle signal X2, computation processing based on a digital value to be computed and digital values corresponding to several symbols before and after the digital value to be computed. The computation processing performed by the DFE 34 uses tap coefficients that are based on some of the signals TAP input from the control circuit 50. The DFE 34 generates a signal X3 as a result of the computation processing. Namely, the signal X3, like the signals X0, X1, and X2, is a digital signal. A one-cycle signal X3 is a collection of n digital values. The DFE 34 outputs the signal X3 to the data comparator circuit 35.

The signal X3 is input to the data comparator circuit 35. Based on the signal X3, the data comparator circuit 35 determines data encoded by the host device 2, as the data Af. Specifically, when the PAM4 is applied, the data comparator circuit 35 determines the values of 2-bit data for each of the n digital values included in a one-cycle signal X3. The data comparator circuit 35 outputs the data Af to a subsequent circuit.

1.1.5 Clock Data Recovery Circuit

Figure 4:
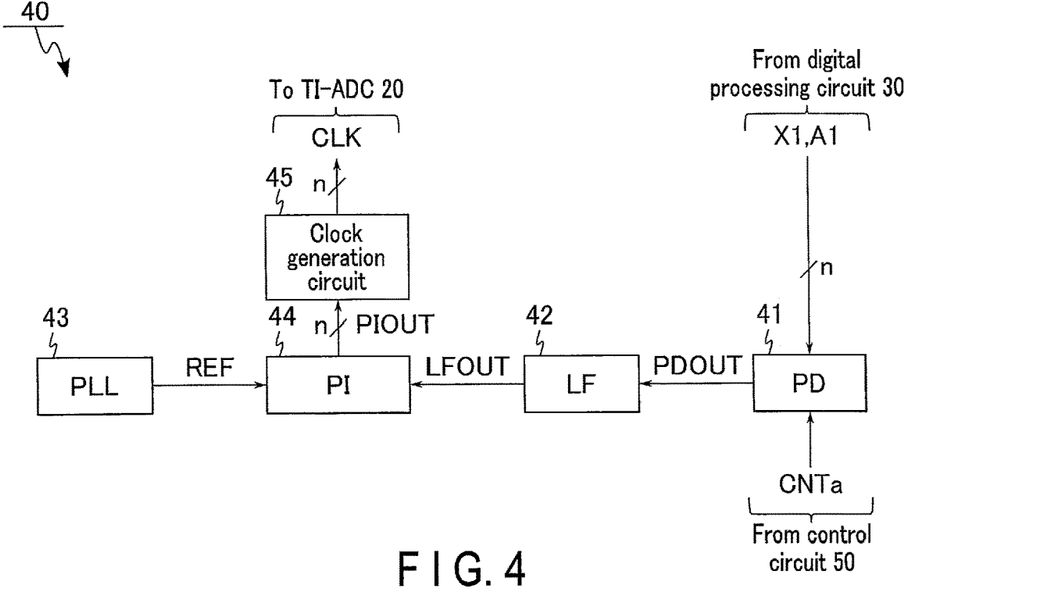
FIG. 4 is a block diagram showing an example of a configuration of a clock data recovery circuit of the receiver circuit according to the first embodiment.

Next, an internal configuration of the clock data recovery circuit (CDR) of the receiver circuit according to the first embodiment will be described. FIG. 4 is a block diagram showing an example of a configuration of the clock data recovery circuit of the receiver circuit according to the first embodiment.

The CDR 40 includes a PD 41, an LF 42, a PLL 43, a PI 44, and a clock generation circuit 45.

The PD 41 is a mueller-muller (MM) baud-rate phase detector. The MM baud-rate phase detector uses a single sampling result per symbol for detecting phase shifting of the signal CLK. The MM baud-rate phase detector does not use sampling results of edges (boundary) of pulses corresponding to the data encoded in the signals S0 and /S0 when detecting the phase shifting. The signal X1 and the data A1 are input from the digital processing circuit 30 to the PD 41. A signal CNTa included in the signal CNT is input from the control circuit 50 to the PD 41. According to the signal CNTa, the PD 41 calculates a value PDOUT based on the signal X1 and the data A1. The value PDOUT is a value corresponding to a phase gap between current sampling timing by the signal CLK and optimal sampling timing. The PD 41 outputs the value PDOUT to the LF 42.

The LF 42 is a loop filter. The value PDOUT is input to the LF 42. The LF 42 calculates a value LFOUT based on the value PDOUT. The value LFOUT is a value corresponding to a phase correction amount of the signal CLK. The LF 42 outputs the value LFOUT to the PI 44.

The PLL 43 is a phase-locked loop circuit. The PLL 43 generates a signal REF. The signal REF is a reference signal having a reference frequency in the receiver circuit. The PLL 43 outputs the signal REF to the PI 44. In the description below, a difference between the reference frequency of the signal REF and the frequency of the clock signals embedded in the signals S0 and /S0 by the host device 2 will also be referred to as a "frequency deviation".

The PT 44 is a phase interpolator. The value LFOUT is input from the LF 42 to the PI 44, and the signal REF is input from the PLL 43 to the PI 44. The PI 44 generates a signal PIOUT from the signal REF based on the value LFOUT. The signal PIOUT is an n-phase signal obtained by correcting the phase. The PI 44 outputs the signal PIOUT to the clock generation circuit 45.

The signal PIOUT is input to the clock generation circuit 45. The clock generation circuit 45 generates the signal CLK based on the signal PIOUT. The clock generation circuit 45 uses, for example, a frequency divider circuit to generate the signal CLK. The clock generation circuit 45 outputs the signal CLK to the TI-ADC 20.

1.1.6 Phase Detector

Figure 5:
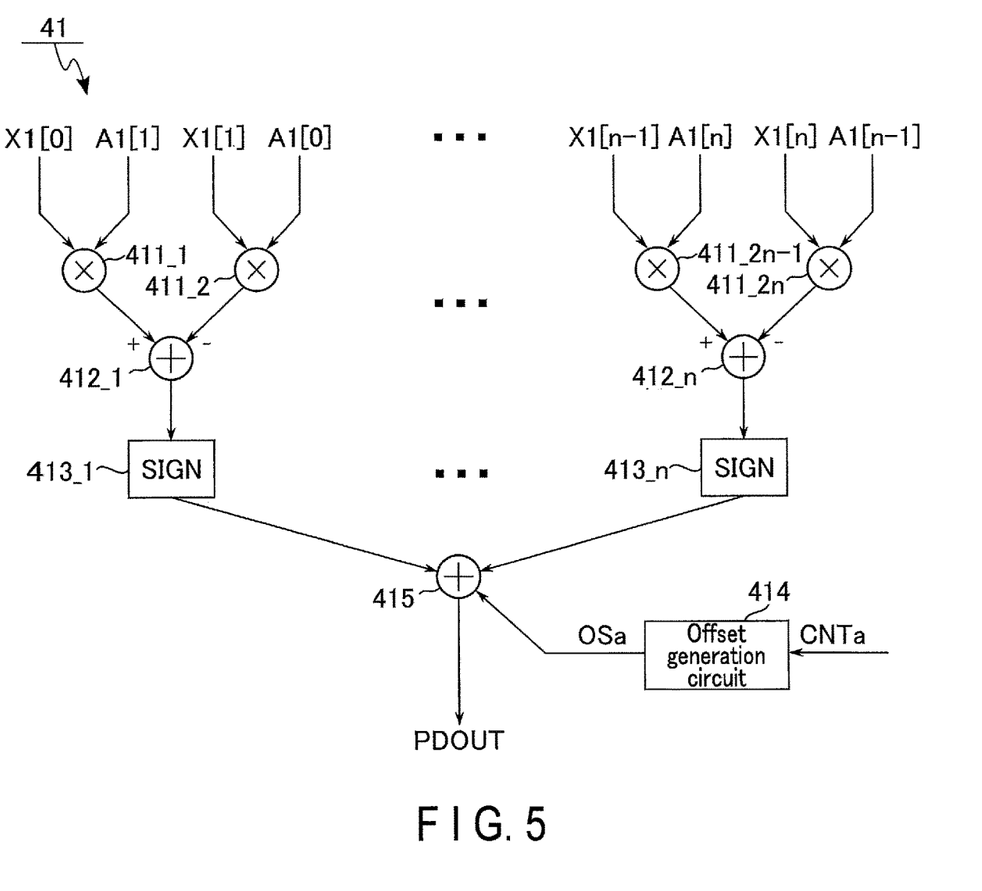
FIG. 5 is a block diagram showing an example of a configuration of a phase detector of the clock data recovery circuit according to the first embodiment.

Next, an internal configuration of the phase detector (PD) of the clock data recovery circuit according to the first embodiment will be described. FIG. 5 is a block diagram showing an example of a configuration of the phase detector of the clock data recovery circuit according to the first embodiment.

The PD 41 includes a plurality of multipliers 411, a plurality of adders 412, a plurality of sign function circuits 413, an offset generation circuit 414, and an adder 415. The plurality of multipliers 411 include 2n multipliers 411_1, 411_2, ..., 411_(2k−1) (not shown), 411_2k (not shown), ..., 411 (2n−1), and 411_2n. The plurality of adders 412 include n adders 412_1, ..., 412_k (not shown), ..., and 412_n. The plurality of sign function circuits 413 include n sign function circuits 413_1, ... 413_k (not shown), ..., and 413_n. Herein, k is an integer of 2 or more and (n−1) or less (2≤k≤n−1).

In FIG. 5, the n digital values included in a one-cycle signal X1 are represented as a value $X1[1], \ldots$, and $X1[n]$. Likewise, the n digital values included in one-cycle data A1 are represented as a value $A1[1], \ldots$, and $A1[n]$. The values $X1[0]$ and $A1[0]$ correspond to a symbol one symbol previous to the symbol of the values $X1[1]$ and $A1[1]$, respectively. For example, the values $X1[0]$ and $A1[0]$ are a value $X1[n]$ included in the signal X1 and a value $A1[n]$ included in the data A1, respectively, in the CDR loop one cycle previous. The values $X1[0]$ and $A1[0]$ are stored in advance in a register (not shown), for example, when performing the CDR loop one cycle previous.

The multiplier 411_1 multiplies the value $X1[0]$ and the value $A1[1]$. The multiplier 411_1 outputs a value $X1[0]A1[1]$ to the adder 412_1 as a computation result.

The multiplier 411_2 multiplies the value $X1[1]$ and the value $A1[0]$. The multiplier 411_2 outputs a value $X1[1]A1[0]$ to the adder 412_1 as a computation result.

The adder 412_1 subtracts the value $X1[1]A1[0]$ from the value $X1[0]A1[1]$. The adder 412_1 outputs a value $(X1[0]A1[1]-X1[1]A1[0])$ to the sign function circuit 413_1 as a computation result.

The sign function circuit 413_1 determines whether the value $(X1[0]A1[1]-X1[1]A1[0])$ is positive or negative. If the value $(X1[0]A1[1]-X1[1]A1[0])$ is positive, the sign function circuit 413_1 outputs "1" to the adder 415. If the value $(X1[0]A1[1]-X1[1]A1[0])$ is negative, the sign function circuit 413_1 outputs "−1" to the adder 415.

The multiplier 411_(2k−1) multiplies a value $X1[k-1]$ and a value $A1[k]$. The multiplier 411_(2k−1) outputs a value $X1[k-1]A1[k]$ to the adder 412_k as a computation result.

The multiplier 411_2k multiplies a value $X1[k]$ and a value $A1[k-1]$. The multiplier 411_2k outputs a value $X1[k]A1[k-1]$ to the adder 412_k as a computation result.

The adder 412_k subtracts the value $X1[k]A1[k-1]$ from the value $X1[k-1]A1[k]$. The adder 412_k outputs a value $(X1[k-1]A1[k]-X1[k]A1[k-1])$ to the sign function circuit 413_k as a computation result.

The sign function circuit 413_k determines whether the value $(X1[k-1]A1[k]-X1[k]A1[k-1])$ is positive or negative. If the value $(X1[k-1]A1[k]-X1[k]A1[k-1])$ is positive, the sign function circuit 413_k outputs "1" to the adder 415. If the value $(X1[k-1]A1[k]-X1[k]A1[k-1])$ is negative, the sign function circuit 413_k outputs "−1" to the adder 415.

The descriptions of the multipliers 411_(2k−1) and 411_2k, the adder 412_k, and the sign function circuit 413_k are true for all the k of 2 or more and (n−1) or less.

Likewise, the multiplier 411_(2n−1) multiplies a value $X1[n-1]$ and a value $A1[n]$. The multiplier 411 (2n−1) outputs a value $X1[n-1]A1[n]$ to the adder 412_n as a computation result.

The multiplier 411_2n multiplies a value $X1[n]$ and a value $A1[n-1]$. The multiplier 411_2n outputs a value $X1[n]A1[n-1]$ to the adder 412_n as a computation result.

The adder 412_n subtracts the value $X1[n]A1[n-1]$ from the value $X1[n-1]A1[n]$. The adder 412_n outputs a value $(X1[n-1]A1[n]-X1[n]A1[n-1])$ to the sign function circuit 413_n as a computation result.

The sign function circuit 413_n determines whether the value $(X1[n-1]A1[n]-X1[n]A1[n-1])$ is positive or negative. If the value $(X1[n-1]A1[n]-X1[n]A1[n-1])$ is positive, the sign function circuit 413_n outputs "1" to the adder 415. If the value $(X1[n-1]A1[n]-X1[n]A1[n-1])$ is negative, the sign function circuit 413_n outputs "−1" to the adder 415.

The signal CNTa is input from the control circuit 50 to the offset generation circuit 414. The offset generation circuit 414 generates offset OSa according to the signal CNTa. The offset generation circuit 414 outputs the generated offset OSa to the adder 415. The offset generation circuit 414 may generate two or more different values as the offset OSa according to the signal CNTa. The offset OSa will be detailed later.

The adder 415 adds the "1" or "−1" input from each of the n sign function circuits 413_1 to 413_n, and the offset OSa. The adder 415 outputs a computation result as the value PDOUT to the LF 42.

1.1.7 Loop Filter

Figure 6:
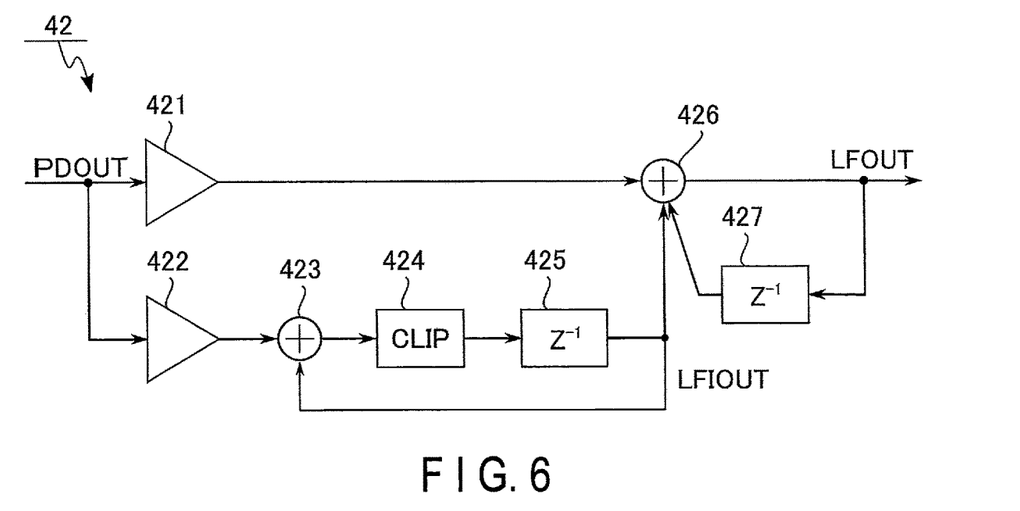
FIG. 6 is a block diagram showing an example of a configuration of a loop filter of the clock data recovery circuit according to the first embodiment.

Next, an internal configuration of the loop filter (LF) of the clock data recovery circuit according to the first embodiment will be described. FIG. 6 is a block diagram showing an example of a configuration of the loop filter of the clock data recovery circuit according to the first embodiment.

The LF 42 includes multipliers 421 and 422, adders 423 and 426, a clip circuit 424, and delay circuits 425 and 427. The multiplier 422, the adder 423, the clip circuit 424, and the delay circuit 425 function as an integrator.

The value PDOUT is input to the multiplier 421. The multiplier 421 multiplies the value PDOUT based on a certain multiplier factor. The multiplier 421 outputs the computation result to the adder 426.

The value PDOUT is input to the multiplier 422. The multiplier 422 multiplies the value PDOUT based on a certain multiplier factor. The multiplier factor of the multiplier 422 may be equal to the multiplier factor of the multiplier 421. The multiplier factor of the multiplier 422 may be different from the multiplier factor of the multiplier 421. The multiplier 422 outputs the computation result to the adder 423.

The adder 423 adds the computation result of the value PDOUT by the multiplier 422 and a value LFIOUT of a previous cycle fed back from the delay circuit 425. The adder 423 outputs the computation result to the clip circuit 424.

The clip circuit 424 performs clip processing on the computation result of the adder 423. The clip circuit 424 outputs the result of the clip processing to the delay circuit 425. Specifically, when the computation result of the adder 423 exceeds an upper limit, the clip circuit 424 outputs the upper limit to the delay circuit 425. When the computation result of the adder 423 falls below a lower limit, the clip circuit 424 outputs the lower limit to the delay circuit 425. When the computation result of the adder 423 is in a range of the lower limit to the upper limit, the clip circuit 424 outputs the computation result of the adder 423 to the delay circuit 425.

The delay circuit 425 outputs the result of the clip processing performed by the clip circuit 424 to the adders 423 and 426 as the value LFIOUT, for example, after a delay of one cycle. The value LFIOUT corresponds to a frequency deviation.

The adder 426 adds the value PDOUT multiplied by the multiplier 421, the value LFIOUT, and the value LFOUT of a previous cycle fed back from the delay circuit 427. The adder 426 outputs the computation result to the delay circuit 427 and the PI 44 as the value LFOUT.

The delay circuit 427 feeds back the value LFOUT to the adder 426, for example, after a delay of one cycle.

1.2 Operation

Next, an operation of the receiver device according to the first embodiment will be described.

1.2.1 Reception Operation Including CDR Loop

Figure 7:
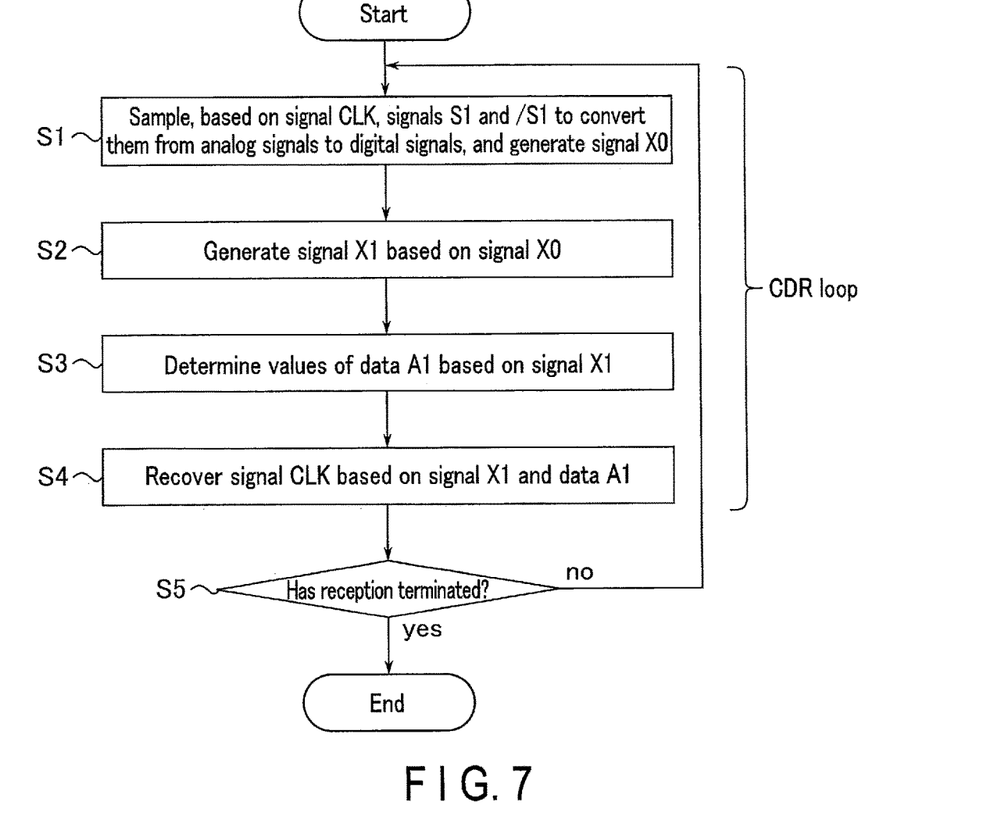
FIG. 7 is a flowchart showing an example of a reception operation including a CDR loop of the receiver device according to the first embodiment.

First, a reception operation including a CDR loop of the receiver device according to the first embodiment will be described. FIG. 7 is a flowchart showing an example of the reception operation including the CDR loop of the receiver device according to the first embodiment.

When reception of the signals S0 and /S0 is started (Start), the TI-ADC 20 samples, based on the signal CLK, signals S1 and /S1 generated based on the signals S0 and/S0 to convert them from analog signals to digital signals, and generate a one-cycle signal X0 (S1).

The FFE 31 of the digital processing circuit 30 generates a one-cycle signal X1 based on the one-cycle signal X0 (S2).

The data comparator circuit 32 of the digital processing circuit 30 determines the values of one-cycle data A1 based on the one-cycle signal X1 (S3).

The CDR 40 recovers the signal CLK based on the one-cycle signal X1 and data A1 (S4).

The host interface circuit 8 determines whether the reception of the signals S0 and /S0 has terminated or not based on whether there is an input of the signals S1 and /S1 or not (S5).

If the reception of the signals S0 and /S0 has not terminated (S5; no), the TI-ADC 20 generates a signal X0 of the next cycle based on the recovered signal CLK (S1). Thereby, the process of S1 to S4 is repeated until the reception of the signals S0 and /S0 terminates (CDR loop).

If the reception of the signals S0 and /S0 has terminated (S5; yes), the reception operation will end (End).

1.2.2 Phase Detection Operation

Next, a phase detection operation according to the first embodiment will be described.

Figure 8:
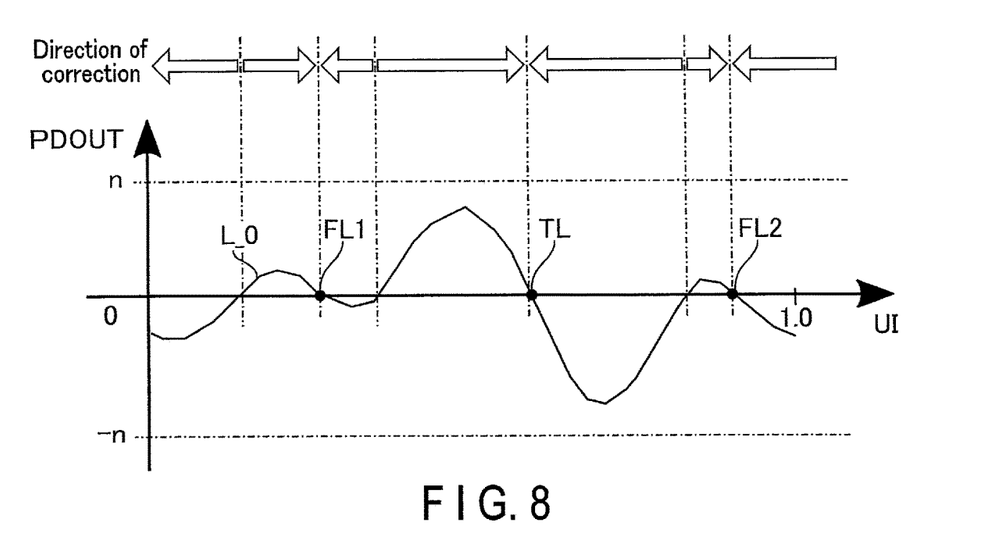
FIG. 8 is a diagram showing an example of output by the phase detector not involving an offset control operation in the receiver device according to the first embodiment.

FIG. 8 is a diagram showing an example of output by the phase detector not involving an offset control operation in the receiver device according to the first embodiment. In the example shown in FIG. 8, the vertical axis represents the value PDOUT, which is an output of the PD 41 of the CDR 40. The horizontal axis represents an amount of phase shifting from sampling timing in a cycle of a CDR loop in terms of a unit interval (UI). Herein, a range from 0 UI to 1 UI corresponds to one symbol. Also, in the example shown in FIG. 8, an example of the history of the values PDOUT obtained when the amount of phase shifting from the sampling timing in a cycle of a CDR loop is varied between 0 UI to 1 UI, is represented by a line L_0. The line L_0 corresponds to a case where the offset OSa is 0.

When the value PDOUT is positive, the CDR 40 delays the phase of the signal CLK. When the value PDOUT is negative, the CDR 40 advances the phase of the signal CLK. Thus, when the CDR loop is repeated, the phase of the signal CLK converges toward a point where the value PDOUT switches from positive to negative along a direction in which the phase proceeds. This point is referred to as a convergence point. The CDR 40 locks the phase of the signal CLK based on the amount of phase shifting at the convergence point. However, when the PAM4 is applied to the PD 41, which is an MM phase detector, the value PDOUT on the line L_0 may have three positive peaks and three negative peaks in the range from 0 UI to 1 UI so as to cross the border of 0. Thus, the line L_0 may have not only a true convergence point TL indicating an optimal amount of phase shifting but also false convergence points FL1 and FL2 indicating an amount of phase shifting that is not optimal. Namely, when the PAM4 is applied, there is at least one phase that may be erroneously locked by the CDR 40. Accordingly, in order to prevent the amount of phase shifting from converging toward the false convergence points FL1 and FL2, the control circuit 50 controls the value of the offset OSa.

Herein, the values PDOUT at the three positive peaks are from 0 to n. The values PDOUT at the three negative peaks are from −n to 0. Also, the values PDOUT at the positive and negative peaks with the true convergence point TL interposed between the positive and negative peaks are larger than the values PDOUT at the positive and negative peaks with each of the false convergence points FL1 and FL2 interposed between the positive and negative peaks. Namely, the values PDOUT at the positive and negative peaks with the true convergence point TL interposed between the positive and negative peaks are a maximum value and a minimum value, respectively, on the line L_0.

Figure 9:
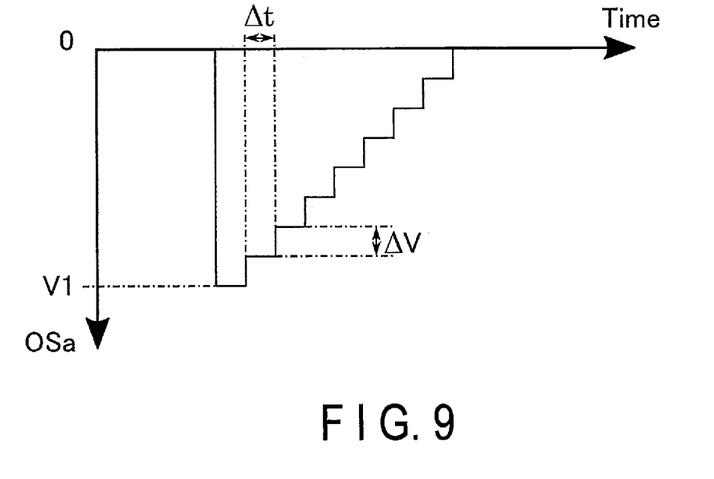
FIG. 9 is a diagram showing an example of an offset control operation of the receiver device according to the first embodiment.

FIG. 9 is a diagram showing an example of the offset control operation of the receiver device according to the first embodiment. FIG. 9 shows a temporal change in the offset OSa output to the adder 415 included in the PD 41 of the CDR 40. The horizontal axis represents time, and the vertical axis represents a value of the offset OSa.

The offset generation circuit 414 of the PD 41 stores, for example, values V1 and ΔV. In the example shown in FIG. 9, the value V1 is a negative value. An absolute value of the value V1 is, for example, the value of n or more shown in FIG. 8.

The control circuit 50 outputs a signal CNTa to start output of the offset OSa. When the signal CNTa to start output of the offset OSa is input, the offset generation circuit 414 outputs the value V1 to the adder 415 as the offset OSa. The offset OSa is maintained at the value V1 during a period Δt. The period Δt is, for example, longer than a period corresponding to multiple cycles of a CDR loop. Thus, multiple CDR loops are performed during the period Δt.

When the period Δt elapses after the output of the offset OSa is started, the control circuit 50 outputs a signal CNTa to increment the offset OSa. When the signal CNTa to increment the offset OSa is input, the offset generation circuit 414 increments the offset OSa by the amount of the value ΔV. Then, the offset OSa is maintained during the period Δt.

When the period Δt elapses after the offset OSa is incremented, the control circuit 50 again outputs a signal CNTa to increment the offset OSa. When the signal CNTa to increment the offset OSa is input, the offset generation circuit 414 further increments the offset OSa by the amount of the value ΔV. Then, the offset OSa is maintained during the period Δt.

In this manner, the offset OSa is controlled to approach 0 from the value V1 by the amount of the value ΔV for each period Δt. When the offset OSa reaches 0, the offset OSa is fixed to 0.

Through the above process, the operation of controlling the offset OSa is completed.

Figure 10:
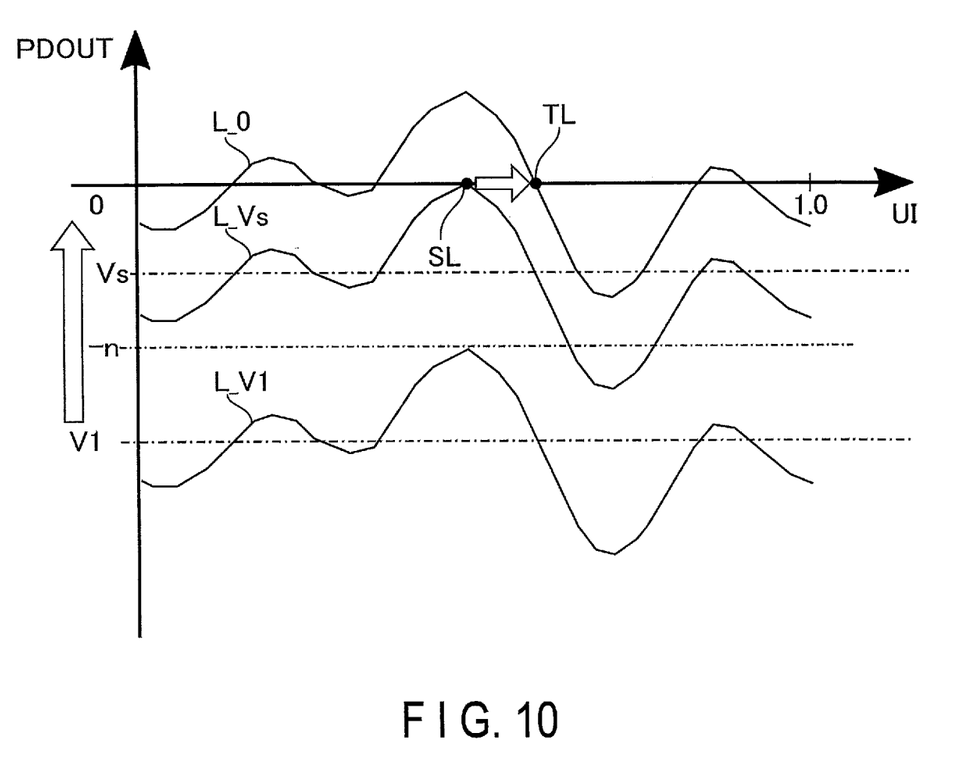
FIG. 10 is a diagram showing an example of a change in the output by the phase detector involving the offset control operation in the receiver device according to the first embodiment.

FIG. 10 is a diagram showing an example of the output by the phase detector involving an offset control operation in the receiver device according to the first embodiment. The horizontal axis and the vertical axis shown in FIG. 10 are the same as those shown in FIG. 8.

As shown in FIG. 9, the value PDOUT is first offset by the amount of the value V1. Thus, the line L_0 shown in FIG. 8 is shifted to a line L_V1. As described above, an absolute value of the value V1 is a value of n or more. Thus, the value PDOUT on the line L_V1 will be 0 or less over the range from 0 UI to 1 UI. Namely, when the value V1 is given as the offset OSa, the CDR 40 will be in a state where the phase of the signal CLK is unlocked.

Then, the offset OSa is gradually brought closer to 0 from the value V1. When the offset OSa becomes a value Vs (V1<Vs<0), a line L_V0 will be shifted to a line L_Vs. On the line L_Vs, the offset OSa becomes 0 at a peak point SL, where the value PDOUT is maximum. Namely, when the value Vs is given as the offset OSa, the CDR 40 locks the phase of the signal CLK based on the amount of phase shifting corresponding to the peak point SL.

Then, the offset OSa is further brought closer to 0 from the value Vs. As a result, the value PDOUT at the peak point SL becomes positive. Thereby, the CDR 40 delays the phase of the signal CLK so that the value PDOUT becomes 0. Accordingly, the lock position approaches the true convergence point TL from the peak point SL. The lock position finally reaches the true convergence point TL when the offset OSa is returned to 0.

1.3 Advantageous Effects of First Embodiment

According to the first embodiment, the TI-ADC 20, the digital processing circuit 30, and the CDR 40 perform the CDR loop, to thereby adjust the phase shifting of the signal CLK. The PD 41 of the CDR 40 calculates the value PDOUT based on the signal X1 and the data A1. The offset OSa is added to the value PDOUT. The LF 42 of the CDR 40 calculates the value LFOUT corresponding to a correction amount of the phase of the signal CLK so as to bring the value PDOUT closer to zero. The control circuit 50 first adds the value V1 as the offset OSa. Thereby, an absolute value of the value PDOUT becomes a value of n or more over the range from 0 UI to 1 UI. Accordingly, the CDR 40 will be in a state where the phase of the signal CLK is unlocked.

Thereafter, the control circuit 50 gradually changes the offset OSa from the value V1 toward zero. When the offset OSa becomes the value Vs, the value PDOUT becomes 0 at the peak point SL on the line L_Vs. Thus, the CDR 40 locks the phase of the signal CLK based on the amount of phase shifting corresponding to the maximum peak among the multiple peaks present on the line L_0 shown in FIG. 8.

Thereafter, the control circuit 50 gradually further changes the offset OSa from the value Vs toward zero. As a result, the value PDOUT at the peak point SL becomes positive. Thereby, the CDR 40 delays the phase of the signal CLK so that the value PDOUT becomes 0. Thus, the lock position approaches the true convergence point TL from the peak point SL. Accordingly, the lock position can finally converge to the true convergence point TL when the offset OSa is returned to 0.

As supplemental information, the PD 41 is an MM baud-rate phase detector. Specifically, the PD 41 calculates the value PDOUT based on a value (X[0]A[1]−X[1]A[0]). Thereby, when the PAM4 is applied, the value PDOUT has a plurality of peaks over the range from 0 UI to 1 UI. Therefore, the CDR 40 may erroneously lock the phase of the signal CLK based on the amount of phase shifting that is based on the false convergence points FL1 and FL2. According to the first embodiment, the offset OSa is given to the value PDOUT so that the phase of the signal CLK can be locked at the maximum peak of the value PDOUT. Thereby, the possibility can be eliminated of locking the phase of the signal CLK based on the amount of phase shifting that is based on the false convergence points FL1 and FL2. Therefore, the erroneous locking can be suppressed.

Additionally, the control circuit 50 gradually changes the offset OSa for each period Δt. The period Δt is longer than a cycle of a CDR loop. This allows the CDR 40 to maintain a state where the phase of the signal CLK is locked while the offset OSa is approaching 0 from the value Vs.

Also, the LF 42 includes an integrator including the clip circuit 424. Thereby, it is possible to suppress an excessive increase in the value LFIOUT, which is an output value of the integrator, in a state where the phase of the signal CLK is intentionally unlocked by the CDR 40 (i.e., a state where the offset OSa is between the value V1 and the value Vs and where the period in which the value PDOUT is excessively large continues). Accordingly, destabilization of the control system of the LF 42 can be suppressed. As a result, the value LFIOUT can be converged to a value corresponding to a frequency deviation after the CDR 40 locks the phase of the signal CLK.

2. Second Embodiment

Next, a second embodiment will be described.

The second embodiment is different from the first embodiment in that the value LFOUT is offset. The description provided below will concentrate on mainly the aspects of the configuration and the operation different from those of the first embodiment. Descriptions of the aspects of the configuration and the operation equivalent to those of the first embodiment will be omitted as appropriate.

2.1 Configuration of Clock Data Recovery Circuit

Figure 11:
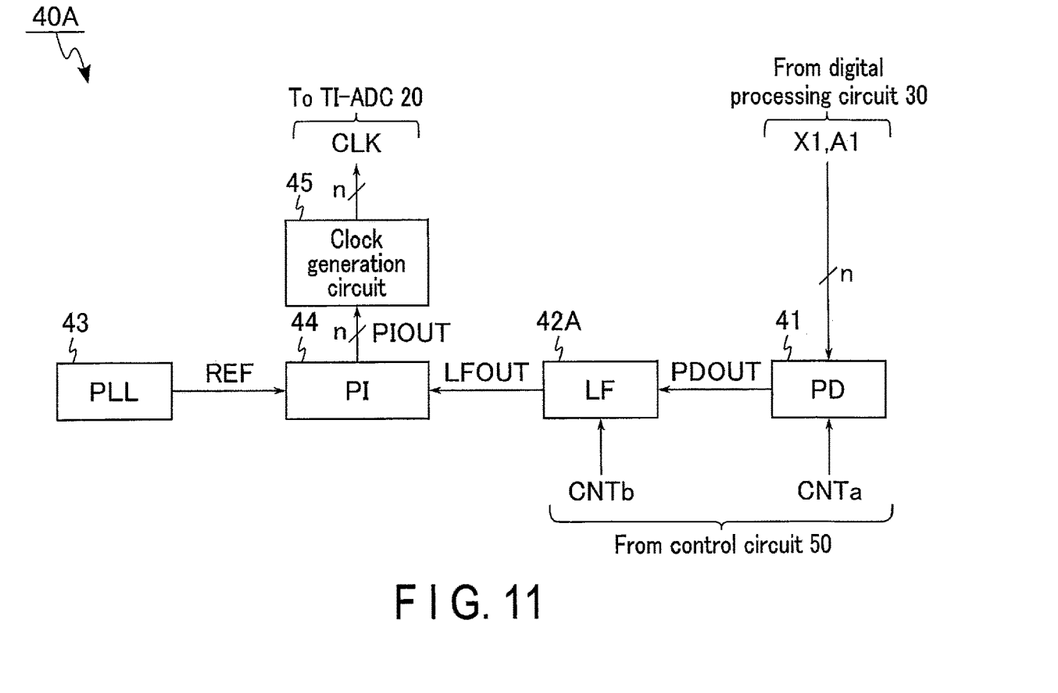
FIG. 11 is a block diagram showing an example of a configuration of a clock data recovery circuit of a receiver circuit according to a second embodiment.

FIG. 11 is a block diagram showing an example of a configuration of a clock data recovery circuit (CDR) of a receiver circuit according to a second embodiment. FIG. 11 corresponds to FIG. 4 to which reference was made in the first embodiment.

A CDR 40A provided to the receiver circuit according to the second embodiment includes the PD 41, an LF 42A, the PLL 43, the PI 44, and the clock generation circuit 45. Since the configurations of the PD 41, the PLL 43, the PI 44, and the clock generation circuit 45 are the same as those in the first embodiment, description thereof will be omitted.

The LF 42A is a loop filter. The value PDOUT is input to the LF 42A. A signal CNTb included in the signal CNT is input from the control circuit 50 to the LF 42A. The LF 42A calculates the value LFOUT based on the value PDOUT according to the signal CNTb. The LF 42A outputs the value LFOUT to the PI 44.

2.2 Configuration of Loop Filter

Figure 12:
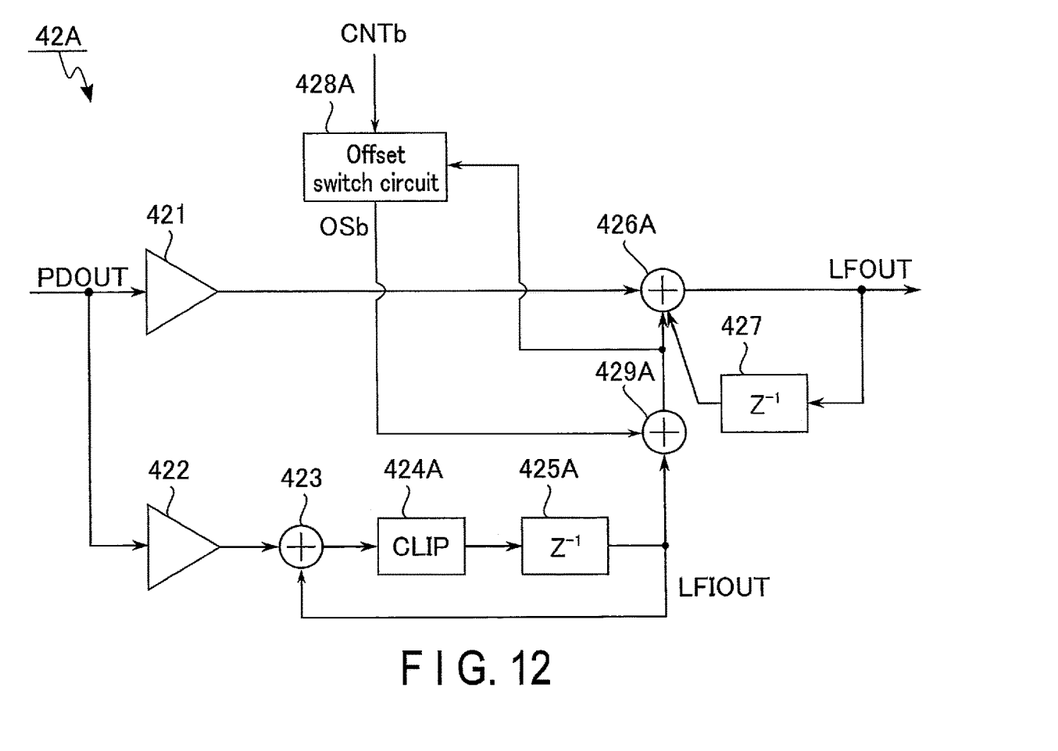
FIG. 12 is a block diagram showing an example of a configuration of a loop filter of the clock data recovery circuit according to the second embodiment.

FIG. 12 is a block diagram showing an example of a configuration of the loop filter (LF) of the clock data recovery circuit according to the second embodiment. FIG. 12 corresponds to FIG. 6 to which reference was made in the first embodiment.

The LF 42A includes the multipliers 421 and 422, the adder 423, adders 426A and 429A, a clip circuit 424A, a delay circuit 425A, the delay circuit 427, and an offset switch circuit 428A.

Since the configurations of the multipliers 421 and 422, the adder 423, and the delay circuit 427 are the same as those in the first embodiment, description thereof will be omitted.

The signal CNTb is input from the control circuit 50 to the offset switch circuit 428A. The offset switch circuit 428A generates a value equal to a value output from the adder 429A according to the signal CNTb. The offset switch circuit 428A outputs the generated value to the adder 429A as an offset OSb. The offset switch circuit 428A outputs an initial value to the adder 429A as the offset OSb until the offset switch circuit 428A generates the value equal to the value output from the adder 429A. Namely, the offset switch circuit 428A switches the offset OSb to be output to the adder 429A from the initial value to the value LFIOUT according to the signal CNTb. Any real number may be applied to the initial value.

The clip circuit 424A changes a range of the clip processing from a first range to a second range after the offset switch circuit 428A switches the offset OSb according to the signal CNTb. The first range is broader than the second range. The second range is equivalent to or narrower than the range of the clip processing performed by the clip circuit 424 in the first embodiment.

The delay circuit 425A resets the value LFIOUT after the offset switch circuit 428A switches the offset OSb according to the signal CNTb.

The adder 429A adds the value LFIOUT and the offset OSb. The adder 429A outputs the computation result to the adder 426A and the offset switch circuit 428A.

The adder 426A adds the value PDOUT multiplied by the multiplier 421, the value output from the adder 429A, and the value LFOUT of a previous cycle fed back from the delay circuit 427. The adder 426A outputs the computation result to the delay circuit 427 and the PI 44 as the value LFOUT.

With the configuration described above, it is possible to add a value outside the second range to the adder 426A as a sum of the offset OSb and the value LFIOUT even after the range of the clip processing is narrowed to the second range.

2.3 Reception Operation Including CDR Loop

Figure 13:
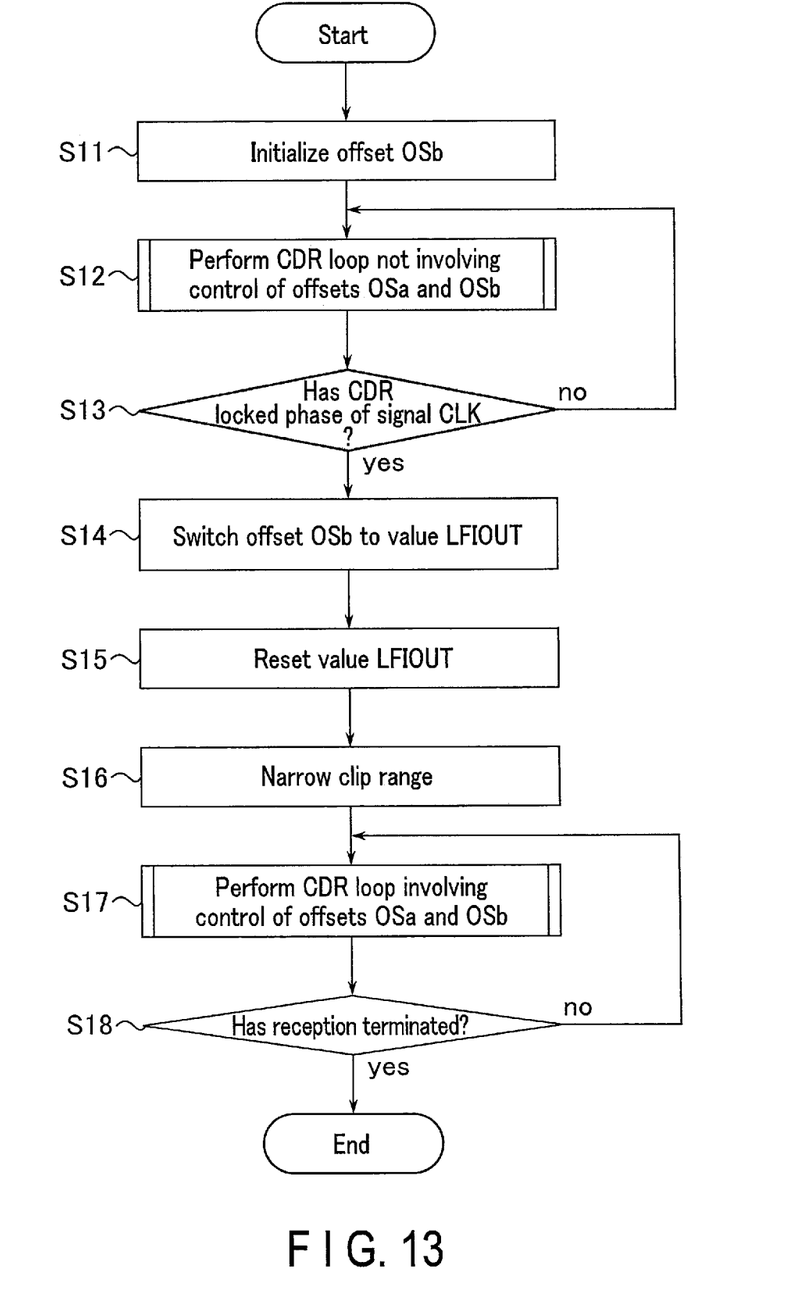
FIG. 13 is a flowchart showing an example of a reception operation including a CDR loop of the receiver device according to the second embodiment.

FIG. 13 is a flowchart showing an example of a reception operation including a CDR loop of the receiver device according to the second embodiment.

When reception of the signals S0 and /S0 is started (Start), the control circuit 50 initializes the offset OSb output from the offset switch circuit 428A to an initial value (S11).

The TI-ADC 20, the digital processing circuit 30, and the CDR 40A perform a CDR loop not involving control of the offsets OSa and OSb (S12). In the CDR loop not involving control of the offsets OSa and OSb, 0 is assigned to the offsets OSa and OSb. At this time, the range of the clip processing performed by the clip circuit 424A is set to the first range.

The control circuit 50 determines whether the CDR 40A has locked the phase of the signal CLK or not (S13). The control circuit 50 determines that the CDR 40A has locked the phase of the signal CLK, for example, when the value PDOUT sufficiently approaches 0 and the amount of a change in the value PDOUT for each CDR loop is sufficiently small. As described with reference to FIG. 8, when the offset OSa is 0, the CDR 40A may have erroneously locked the phase of the signal CLK. However, in the processing of S12, the control circuit 50 determines whether or not the CDR 40A has locked the phase of the signal CLK successfully regardless of whether or not the CDR 40A has erroneously locked the phase of the signal CLK.

When the CDR 40A has not locked the phase of the signal CLK (S13; no), the TI-ADC 20, the digital processing circuit 30, and the CDR 40A continue to perform the CDR loop not involving control of the offsets OSa and OSb (S12). In this manner, the processing of S11 is repeated until the CDR 40A locks the phase of the signal CLK.

When the CDR 40A has locked the phase of the signal CLK (S13; yes), the control circuit 50 causes the offset switch circuit 428A of the LF 42A to store the value LFIOUT. The control circuit 50 switches the offset OSb output from the offset switch circuit 428A from "0" to the value LFIOUT (S14).

After the processing of S14, the control circuit 50 resets the value LFIOUT output from the delay circuit 425A to 0 (S15).

Also, after the processing of S14, the control circuit 50 narrows the range of the clip processing performed by the clip circuit 424A from the first range to the second range (S16).

After the processing of S15 and S16, the TI-ADC 20, the digital processing circuit 30, and the CDR 40A perform a CDR loop involving control of the offsets OSa and OSb (S17). The operation of controlling the offset OSa is similar to that in the first embodiment. In the operation of controlling the offset OSb, the offset OSb stored in the offset switch circuit 428A in the processing of S14 is assigned to the adder 426A.

The host interface circuit 8 determines whether the reception of the signals S0 and /S0 has terminated or not based on whether there is an input of the signals S1 and /S1 or not (S18).

If the reception of the signals S0 and /S0 has not terminated (S18; no), the TI-ADC 20, the digital processing circuit 30, and the CDR 40A continue the CDR loop involving control of the offsets OSa and OSb (S17). Thereby, the processing of S17 is repeated until the reception of the signals S0 and /S0 terminates.

If the reception of the signals S0 and /S0 has terminated (S18; yes), the reception operation will end (End).

2.4 Advantageous Effects of Second Embodiment

According to the second embodiment, the control circuit 50 performs the CDR loop not involving control of the offsets OSa and OSb. The range of the clip processing is set to the first range. Thereby, the CDR 40A can promptly lock the phase of the signal CLK regardless of whether the lock position is correct or not.

Also, the first range of the clip processing is broader than the second range. Therefore, even if the frequency deviation is too large for absorption when the second range is set to the range of the clip processing, it is possible to make the value LFIOUT follow a value corresponding to the frequency deviation.

Also, after the CDR 40A locks the phase of the signal CLK through the CDR loop not involving control of the offsets OSa and OSb, the control circuit 50 switches the offset OSb output from the offset switch circuit 428A from "0" to the value LFIOUT. The control circuit 50 resets the value LFIOUT to 0 after the offset OSb is switched to the value LFIOUT. This makes it possible to input a value corresponding to a frequency deviation to the adder 426A as the offset OSb irrespective of the value LFIOUT. Therefore, in the CDR loop involving control of the offsets OSa and OSb, switching can be made from the value LFIOUT to the offset OSb to fulfill the function of following a value corresponding to the frequency deviation.

Also, the control circuit 50 narrows the range of the clip processing to the second range after the value LFIOUT is stored. Thereby, it is possible to suppress an excessive increase in the value LFIOUT, which is an output value of the integrator, in the state where the phase of the signal CLK is intentionally unlocked by the CDR 40A. Accordingly, destabilization of the control system of the LF 42A can be suppressed. As a result, the value LFIOUT can be converged after the CDR 40A locks the phase of the signal CLK.

In the above second embodiment, the case of storing information on the frequency deviation into the offset switch circuit 428A for the signals S0 and /S0 with 2-bit data superposed on each pulse is described; however, the configuration is not limited thereto. For example, the host interface circuit 8 may store information on the frequency deviation into the offset switch circuit 428A by receiving a signal with 1-bit data superposed on each pulse before receiving the signals S0 and /S0 with 2-bit data superposed on each pulse. A data transmission format in which 1-bit data is superposed on each pulse is also referred to as "non-return to zero (NRZ)".

In this case, the TI-ADC 20, the digital processing circuit 30, and the CDR 40A perform a CDR loop not involving control of the offsets OSa and OSb based on a signal to which the NRZ is applied.

After the CDR 40A has locked the phase of the signal CLK, the control circuit 50 causes the offset switch circuit 428A to store the value LFIOUT. Then, the control circuit 50 switches the offset OSb output from the offset switch circuit 428A from "0" to the value LFIOUT.

After the offset OSb is switched to the value LFIOUT, the control circuit 50 resets the value LFIOUT and narrows the range of the clip processing performed by the clip circuit 424A.

Thereafter, the TI-ADC 20, the digital processing circuit 30, and the CDR 40A perform a CDR loop involving control of the offsets OSa and OSb based on a signal to which the PAM4 is applied.

Through the above operation, advantageous effects equivalent to those of the first embodiment can be produced.

3. Modifications Etc.

The first and second embodiments are not limited to the examples described above, and may adopt various modifications.

In the above first and second embodiments, the case where the value V1 is negative is described; however, the configuration is not limited thereto. For example, the value V1 may be positive. In this case, an absolute value of the value V1 is a value of n or more. Namely, the absolute value of the value V1 is equal to or greater than a maximum value (=n) of an absolute value of the value that the value PDOUT may take. Thereby, the value PDOUT can be a value of greater than 0 over the range from 0 UI to 1 UI when the value V1 is added as the offset OSa. Accordingly, the CDR 40 can be in the state where the phase of the signal CLK is unlocked, as in the case where the value V1 is negative. Thereafter, the CDR 40 locks the phase of the signal CLK based on a phase corresponding to the peak at which the value PDOUT becomes minimum on the line L_0 shown in FIG. 8 as the offset OSa is brought closer to 0. By further bringing the offset OSa closer to 0, the lock position can finally converge to the true convergence point TL.

In the above first and second embodiments, the case where an absolute value of the value V1 is a value of n or more is also described; however, the configuration is not limited thereto. For example, in the first CDR loop involving control of the offset OSa, the control circuit 50 may cause the offset generation circuit 414 to generate the value Vs. In the second and the subsequent CDR loops involving control of the offset OSa, the offset generation circuit 414 may output the value Vs, in place of the value V1, to the adder 415 as the offset OSa based on the signal CNTa. Thereby, the period of the state in which the CDR 40 has unlocked the phase of the signal CLK can be shortened.

In the above first and second embodiments, the host interface circuit 8 is described as an example of the receiver circuit; however, the configuration is not limited thereto. For example, the receiver circuit may be a semiconductor integrated circuit used in serial communication.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A semiconductor integrated circuit, comprising:
a converter configured to convert an analog signal into a digital signal based on a clock signal;
a comparator circuit configured to determine values of data based on the digital signal;
a recovery circuit configured to recover the clock signal based on the digital signal and the data; and
a control circuit configured to control the recovery circuit, wherein
the recovery circuit includes:
a phase detector configured to calculate a sum of a first value and a first offset, the first value being a value based on the digital signal and the data and relating to a phase of the clock signal; and
a loop filter configured to calculate a correction amount of the phase of the clock signal based on the sum, and
the control circuit is configured to gradually change the first offset from a second value to zero after the second value is added as the first offset.

2. The semiconductor integrated circuit according to claim 1, wherein
the digital signal includes a third value corresponding to a first sampling time and a fourth value corresponding to a second sampling time,
the data includes a fifth value corresponding to the third value and a sixth value corresponding to the fourth value, and
the phase detector is further configured to calculate the first value based on a difference between a product of the third value and the sixth value and a product of the fourth value and the fifth value.

3. The semiconductor integrated circuit according to claim 1, wherein
the first offset is negative or positive, and an absolute value of the second value is equal to or greater than a maximum value of an absolute value of the first value.

4. The semiconductor integrated circuit according to claim 1, wherein the phase detector is an MM baud-rate phase detector.

5. The semiconductor integrated circuit according to claim 1, wherein the control circuit is configured to maintain a value of the first offset to the second value in a period longer than a cycle in which the clock signal is recovered.

6. The semiconductor integrated circuit according to claim 1, wherein the loop filter includes an integrator to which an input value based on the sum is input and from which an output value limited to within a first range is output.

7. The semiconductor integrated circuit according to claim 6, wherein
the control circuit is configured to:
store the output value as a second offset in a state where the first offset is not given,
after storing the second offset, reset the output value and change a range in which the output value is clipped to a second range, the second range being narrower than the first range, and
add the second offset to the output value in a state where the first offset is given.

8. The semiconductor integrated circuit according to claim 1, wherein the data includes data having 2 bits per symbol.

9. A receiver device, comprising:
a semiconductor integrated circuit; and
a data processing circuit configured to utilize data output from the semiconductor integrated circuit,
wherein
the semiconductor integrated circuit includes:
a converter configured to convert an analog signal into a digital signal based on a clock signal;
a comparator circuit configured to determine values of data based on the digital signal;
a recovery circuit configured to recover the clock signal based on the digital signal and the data; and
a control circuit configured to control the recovery circuit,
and wherein
the recovery circuit includes:
a phase detector configured to calculate a sum of a first value and a first offset, the first value being a value based on the digital signal and the data and relating to a phase of the clock signal; and
a loop filter configured to calculate a correction amount of the phase of the clock signal based on the sum, and
the control circuit is configured to gradually change the first offset from a second value to zero after the second value is added as the first offset.

10. The receiver device according to claim 9, wherein
the digital signal includes a third value corresponding to a first sampling time and a fourth value corresponding to a second sampling time,
the data includes a fifth value corresponding to the third value and a sixth value corresponding to the fourth value, and
the phase detector is further configured to calculate the first value based on a difference between a product of the third value and the sixth value and a product of the fourth value and the fifth value.

11. The receiver device according to claim 9, wherein
the first offset is negative or positive, and
an absolute value of the second value is equal to or greater than a maximum value of an absolute value of the first value.

12. The receiver device according to claim 9, wherein the phase detector is an MM baud-rate phase detector.

13. The receiver device according to claim 9, wherein the control circuit is configured to maintain a value of the first offset to the second value in a period longer than a cycle in which the clock signal is recovered.

14. The receiver device according to claim 9, wherein the loop filter includes an integrator to which an input value based on the sum is input and from which an output value limited to within a first range is output.

15. The receiver device according to claim 14, wherein the control circuit is configured to:
store the output value as a second offset in a state where the first offset is not given,
after storing the second offset, reset the output value and change a range in which the output value is clipped to a second range, the second range being narrower than the first range, and
add the second offset to the output value in a state where the first offset is given.

16. The receiver device according to claim 9, wherein the data includes data having 2 bits per symbol.

* * * * *